United States Patent [19]
Tokunoh et al.

[11] Patent Number: 6,020,603
[45] Date of Patent: Feb. 1, 2000

[54] SEMICONDUCTOR DEVICE WITH A BEVELED AND CHAMFERED OUTER PERIPHERAL PORTION

[75] Inventors: Futoshi Tokunoh, Tokyo; Yasuo Tanaka, Fukuoka; Tokumitsu Sakamoto, Fukuoka; Nobuhisa Nakasima, Fukuoka, all of Japan

[73] Assignee: Mitsubishi Denki Kabushiki Kaisha, Tokyo, Japan

[21] Appl. No.: 09/068,974

[22] PCT Filed: Sep. 24, 1996

[86] PCT No.: PCT/JP96/02741

§ 371 Date: May 22, 1998

§ 102(e) Date: May 22, 1998

[87] PCT Pub. No.: WO98/13881

PCT Pub. Date: Apr. 2, 1998

[51] Int. Cl.[7] .......................... H01L 29/74; H01L 31/111; H01L 29/06
[52] U.S. Cl. .......................... 257/171; 257/147; 257/170; 257/623
[58] Field of Search .................... 257/147, 170, 257/171, 623

[56] References Cited

U.S. PATENT DOCUMENTS

| | | | |
|---|---|---|---|
| 4,388,635 | 6/1983 | Watanabe et al. | 257/623 |
| 5,047,824 | 9/1991 | Tokunoh et al. | 257/147 |
| 5,189,509 | 2/1993 | Satoh et al. | 257/718 |
| 5,281,847 | 1/1994 | Tokunoh | 257/618 |
| 5,346,849 | 9/1994 | Tokunoh | 437/66 |
| 5,574,297 | 11/1996 | Sennenbara et al. | 257/135 |
| 5,640,024 | 6/1997 | Morishita et al. | 257/147 |
| 5,710,442 | 1/1998 | Watanabe et al. | 257/171 |

FOREIGN PATENT DOCUMENTS

| | | | |
|---|---|---|---|
| 0 396 326 | 11/1990 | European Pat. Off. | 257/623 |
| 45-22858 | 8/1970 | Japan | 257/623 |
| 46-4539 | 2/1971 | Japan | 257/623 |
| 54-127686 | 10/1979 | Japan | 257/623 |
| 57-44562 | 3/1982 | Japan | 257/623 |
| 59-44869 | 3/1984 | Japan | 257/623 |
| 1-318263 | 12/1989 | Japan | 257/623 |
| 4 88677 | 3/1992 | Japan | 257/623 |

OTHER PUBLICATIONS

Patent abstract of Japan, Vol. 007, No. 255 (E–210), Nov. 12, 1983, JP 58 141563, Aug. 22, 1983.

Patent abstract of Japan, Vol. 006, No. 164 (E–127), Aug. 27, 1982, JP 57 084175, May 26, 1982.

*Primary Examiner*—Steven H. Loke
*Attorney, Agent, or Firm*—Oblon, Spivak, McClelland, Maier & Neustadt, P.C.

[57] ABSTRACT

A high voltage semiconductor device such as a gate turn-off thyristor, reduces surface field concentration of a main P-N junction part and attains withstand voltage increase. In a semiconductor device which has a first conductivity type low-resistance layer, a first conductivity type high-resistance layer arranged adjacently to the low-resistance layer and a second conductivity type low-resistance layer arranged adjacently to the first conductivity type high-resistance layer to hold the first conductivity type high-resistance layer with the first conductivity type low-resistance layer and is formed in a plate shape while its outer periphery is so bevelled that sectional area increases from the first conductivity type low-resistance layer toward the first conductivity type high-resistance layer and from the second conductivity type low-resistance layer toward the first conductivity type high-resistance layer respectively, chamfers or boundary surfaces of a prescribed radius of curvature were formed on boundary parts between bevelled surfaces and an outer periphery surface formed on the outer peripheral part.

6 Claims, 7 Drawing Sheets

θ1 DEPENDENCY OF WITHSTAND VOLTAGE REDUCTION RATIO

θ2 DEPENDENCY OF WITHSTAND VOLTAGE REDUCTION RATIO

SEMICONDUCTOR DEVICE WITH A BEVELED AND CHAMFERED OUTER PERIPHERAL PORTION

BACKGROUND OF THE INVENTION

1. Field of the Invention

The present invention relates to a high voltage semiconductor device such as a gate turn-off thyristor or the like and a method of fabricating the same, and more particularly, it relates to withstand voltage increase and capacity enlargement thereof.

2. Discussion of the Background

It is known that avalanche breakdown takes place at a voltage lower than a withstand voltage of original real ability of a P-N junction in a high voltage semiconductor device such as a high voltage diode or a high voltage gate turn-off thyristor and the high voltage semiconductor device cannot be fabricated unless a surface field of a main P-N junction is weakened.

Therefore, a technique called bevel formation for weakening the electric field by inclining an exposed part of the P-N junction is known.

However, there has been such a problem that, although a device thus inclined, i.e., bevelled, can attain withstand voltage increase as compared with a device not subjected to the bevelling, chipping readily takes place in an edge part formed on a boundary part between its outer peripheral part and the said bevelled part in fabrication, field concentration results from a strain field generated in the chipping part, withstand voltage increase is inhibited, and stable provision of a semiconductor device of a high withstand voltage is difficult as a result.

Particularly as to chipping, there has been such a problem that its influence is large in a semiconductor device of a large capacity in which the diameter of a semiconductor element is large, i.e., the outer peripheral length of the semiconductor element is long, and stable provision of a semiconductor device of a high withstand voltage and a large capacity is difficult as a result.

SUMMARY OF THE INVENTION

The present invention has been proposed in consideration of the aforementioned general circumstances, and aims at attaining stable provision of a semiconductor device of a high withstand voltage and a large capacity having a main P-N junction.

The device of the present invention is structured by forming a chamfer or a boundary surface of a prescribed radius of curvature on a boundary part between at least one of bevelled surfaces and an outer peripheral surface, whereby occurrence of chipping which has generally occurred on the boundary part between the said bevelled surfaces and the said outer peripheral part can be remarkably reduced as compared with the prior art, occurrence of field concentration which has generally occurred by a strain field of the chipping part is prevented, not only withstand voltage increase can be attained as a result but its effect is remarkably satisfactory in such a device of a large capacity that the diameter of a semiconductor element is large, i.e., the outer peripheral length of the semiconductor element is long, and there is an effect of enabling stable provision of a semiconductor device of a large capacity as a result.

Further, the device of the present invention is so structured that the depth of bevelling from an end surface of a second conductivity type low-resistance layer is deeper than a position of an end of that depletion layer from the end surface of the said second conductivity type low-resistance layer which is formed when a voltage is applied between a first conductivity type low-resistance layer and the said second conductivity type low-resistance layer, whereby the depletion layer is bent in the vicinity of the said bevelled surface as it will be shown by a broken line, and as a result, there is such an effect that the field intensity on the surface is reduced as compared with a device not having the said bevelled surface and withstand voltage increase and capacity enlargement of the semiconductor device can be attained.

Further, the device of the present invention is so structured that the field intensity on a bevelled surface formed from the second conductivity type low-resistance layer toward a first conductivity type high-resistance layer is smaller than the field intensity caused in the interior of the said second conductivity type low-resistance layer, whereby withstand voltage reduction caused by field concentration in the outer peripheral part can be inhibited and as a result there is such an effect that withstand voltage increase of the semiconductor device can be attained.

Further, the device of the present invention is structured by setting an angle $\theta 1$ of a bevelled surface formed from the first conductivity type low-resistance layer toward the first conductivity type high-resistance layer with an outer end surface of the said first conductivity type low-resistance layer at 0.5° to 5°, and an angle $\theta 2$ of the bevelled surface formed from the second conductivity type low-resistance layer toward the first conductivity type high-resistance layer with an outer end surface of the second conductivity type low-resistance layer at 1° to 20°, whereby a withstand voltage reduction ratio of about 80%, i.e., a withstand voltage of about 80% of a theoretical value can be ensured in the range of 0.5° to 5° at the angle $\theta 1$, a withstand voltage of about 80% of a logical value can be ensured in the range of 1° to 20° at the angle $\theta 2$ similarly to the angle $\theta 1$, and this is effective for withstand voltage increase and capacity enlargement of the semiconductor device.

Further, the device of the present invention is so structured that the radial length of the bevelled surface is longer on the said first conductivity type low-resistance layer side than on the said second conductivity type low-resistance layer side, whereby a surface distance corresponding to the width of the depletion layer on the bevelled surface is elongated, surface field intensity is reduced and a surface leakage current is reduced in such comparison that the radial length of the other bevelled surface than that bevelled surface, whose radical length is elongated, is kept the same, and as a result, there is such an effect that withstand voltage increase and capacity enlargement of the semiconductor device can be effectively performed.

Further, the device of the present invention is so structured that the chamfer formed on the boundary part between the bevelled surface and the said outer peripheral part, or the boundary surface of the prescribed radius of curvature is worked before formation of the said bevelled surface, whereby chipping of the said boundary part during the formation of said chamfer can be reduced as compared with a conventional method of performing chamfering of the edge part formed on the boundary between the bevelled surface and the outer periphery after formation of the bevelled surface, and there is such an effect that withstand voltage increase and capacity enlargement of the semiconductor device can be attained as a result.

DESCRIPTION OF THE PREFERRED EMBODIMENTS

In order to describe the present invention in more detail, it is described in accordance with the accompanying drawings.

Figure 1:
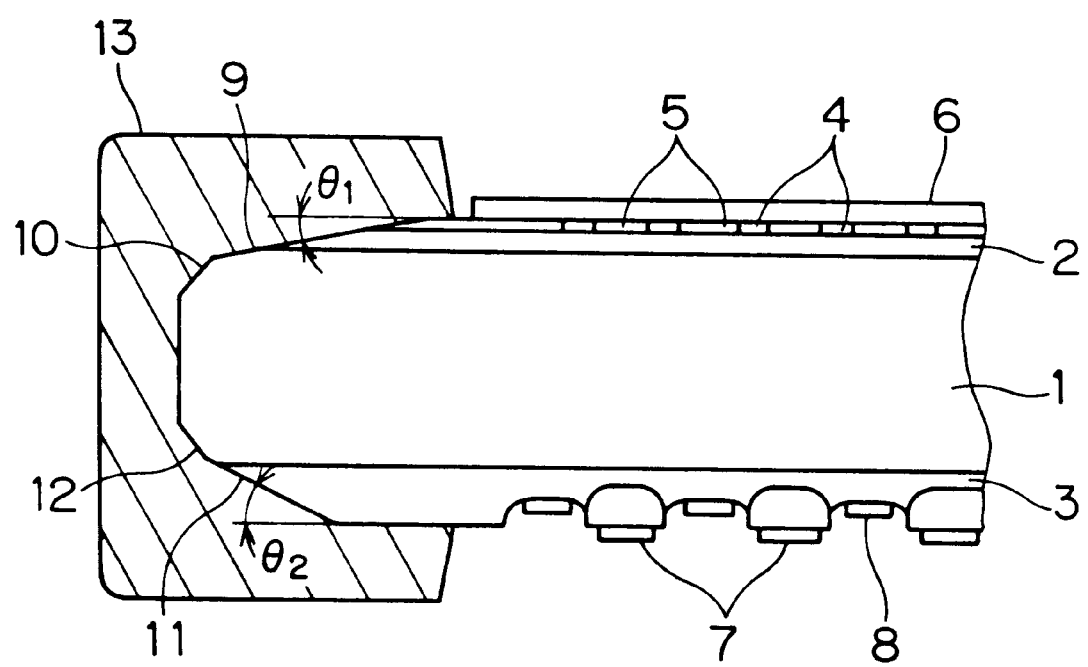
FIG. 1 is a schematic block diagram of an embodiment 1 of the present invention.

FIG. 1 is a diagram showing the structure of an embodiment 1 of the present invention, and symbol 1 denotes an N-type single-crystalline Si wafer substrate of 450 to 900 Ωcm in specific resistance and 700 μm in thickness, which structures a first conductivity type high-resistance layer (N– layer) in the figure. Portion 2 structures a first conductivity type low-resistance layer 2 (N+ layer) formed by diffusing an N-type impurity consisting of phosphorus in one major surface of the first conductivity type high-resistance layer 1. Further, symbol 3 denotes a second conductivity type low-resistance layer (P+ layer) formed by diffusing a P-type impurity consisting of boron in another major surface of the first conductivity type high-resistance layer 1.

Thereafter well-known anode emitters 4, anode short regions 5 and an anode electrode 6 are formed on a surface of the first conductivity type low-resistance layer 2 by a photolithography step, a diffusion step, a metallization step and the like, each well-known as a semiconductor fabrication process.

Cathode electrodes 7 and gate electrodes 8 are formed on a surface of the second conductivity type low-resistance layer 3.

Symbol 9 denotes a bevelled surface which is so worked that the sectional area increases from the first conductivity type low-resistance layer 2 toward the first conductivity type high-resistance layer 1, the bevelled suface is positioned over the outer peripheries of the first conductivity type low-resistance layer 2 and the first conductivity type high-resistance layer 1, and an angle θ1 of the same with an outer end surface of the first conductivity type low-resistance layer 2 is 2.5°. Symbol 10 denotes a chamfer formed to be positioned on a boundary part between the bevelled surface 9 and the outer peripheral surface.

Further, symbol 11 denotes a bevelled surface which is so worked that the sectional area increases from the second conductivity type low-resistance layer 3 toward the first conductivity type high-resistance layer 1, the bevelled surface is positioned over the outer peripheries of the second conductivity type low-resistance layer 3 and the first conductivity type high-resistance layer 1, and an angle θ2 of the same with an outer end surface of the second conductivity type low-resistance layer 3 is 5°. Symbol 12 denotes a chamfer formed to be positioned on a boundary part between the bevelled surface 11 and the outer peripheral surface.

The time of the said bevelling step or the like is now described. After every one of formation of the anode emitters 4, the anode short regions 5 and the anode electrode 6 on the surface of the first conductivity type low-resistance layer 2 described before, and formation of the cathode electrodes 7 and the gate electrodes 8 on the surface of the second conductivity type low-resistance layer 3 is completed, cutting of the outer periphery is performed with a sandblast or a diamond cutter. Thereafter the bevelled surfaces 9 and 11 are worked with a diamond grindstone, and the formation of the chamfers 10 and 12 are performed with the diamond grindstone in succession. Thereafter the outer periphery including the bevelled surfaces 9 and 11 and the parts of the chamfers 10 and 12 is lapped with alumina abrasive grains or diamond abrasive grains and the working is completed.

Symbol 13 denotes well-known passivation rubber integrally covering the bevelled surfaces 9 and 11 and the outer peripheral surface therebetween.

The first conductivity type low-resistance layer 2 and the second conductivity type low-resistance layer 3 may be formed by performing diffusion after epitaxial growth.

An operation of the semiconductor device thus structured is now described. It is as generally known that the portion between the anode electrode 6 and the cathode electrodes 7 turns on and shifts to an ON state when the anode electrode 6 and the cathode electrodes 7 are connected to a load circuit (not shown) while a power supply voltage is applied across the anode electrode 6 and the cathode electrodes 7 and a forward gate current is fed from the gate electrodes 8 to the cathode electrodes 7, the portion between the anode electrode 6 and the cathode electrodes 7 turns off and shifts to an OFF state when a reverse gate current is fed from the gate electrodes 8 to the cathode electrodes 7, and the said load circuit is closed and opened in correspondence to these turn-on and turn-off.

Since the formations of the chamfers 10 and 12 were performed, chipping which has generally occurred on boundary parts between the bevelled surfaces 9 and 11 and the outer peripheral part can be remarkably reduced as compared with the prior art, occurrence of field concentration which has generally occurred due to a strain field of the chipping part is prevented, and not only withstand voltage increase can be attained as a result but its effect is extremely satisfactory in a device of a large capacity in which the diameter of a semiconductor element is large, i.e., the outer peripheral length of the semiconductor element is long, and stable provision of a semiconductor device of a large capacity has been enabled as a result.

Figure 2A:
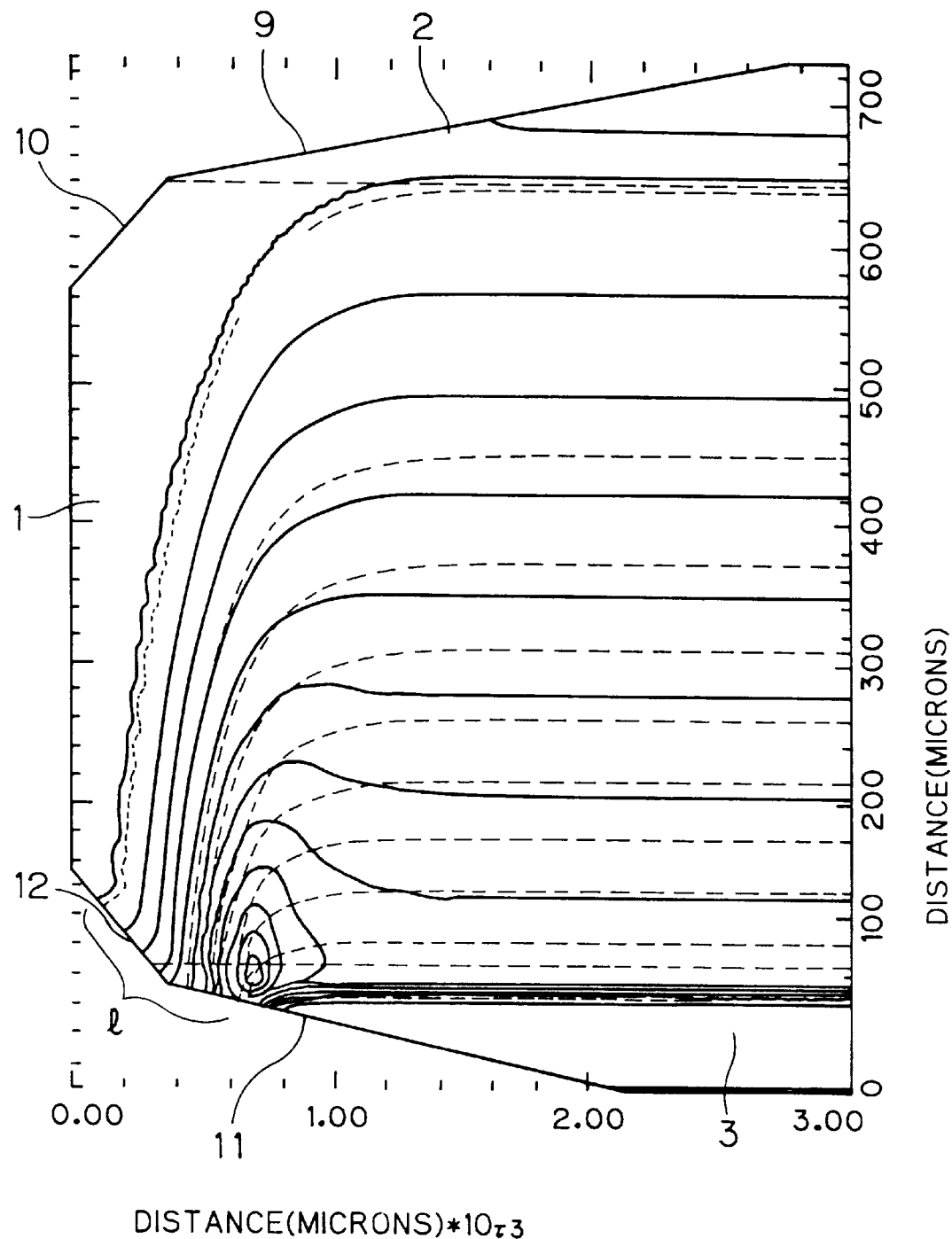
FIGS. 2(a) and 2(b) are explanatory diagrams of the embodiment 1 of the present invention.
Figure 2B:
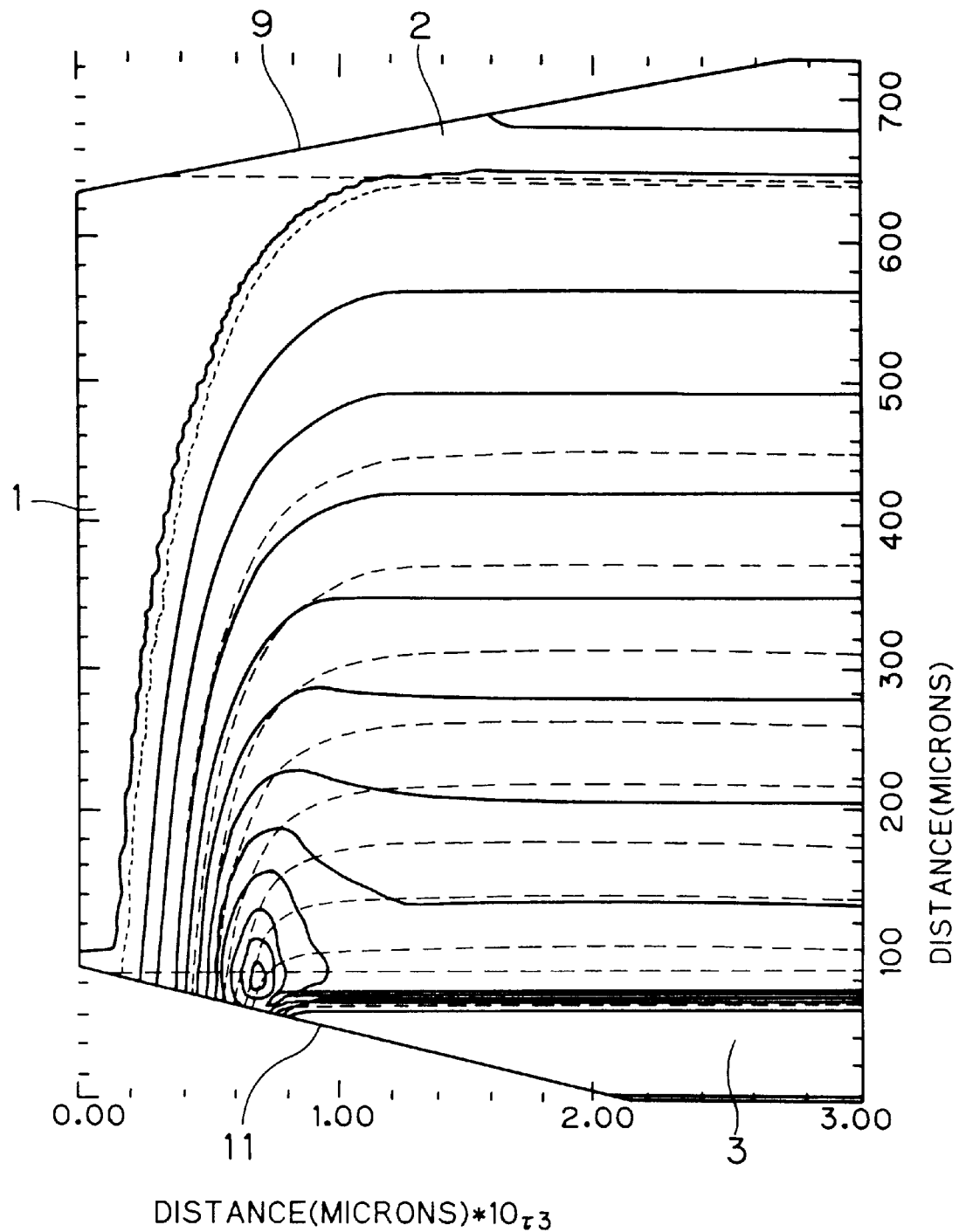

It has been confirmed that surface field intensity on the boundary parts between the bevelled surfaces 9 and 11 and the outer peripheral part is larger on the second conductivity type low-resistance layer 3 side than the first conductivity type low-resistance layer 2 side from results of simulation in FIG. 2(a) (broken lines in the figure indicate changes in extension of a depletion layer in case of changing an applied voltage and solid lines indicate changes in field distribution, and indicate that surface field intensity in the vicinity of the boundary part between the bevelled surface 11 of the second conductivity type low-resistance layer 3 and the outer periphery is larger), and a chamfer effect is prominent on the second conductivity type low-resistance layer 3 side, i.e., the bevelled surface 11 side. Namely, a surface distance l corresponding to the width of the depletion layer elongates as compared with that in FIG. 2(b) with no chamfer by forming the chamfer 12 as shown in FIG. 2(a), whereby the surface field intensity is reduced in proportion to increase in the surface distance l.

When the said bevelled surfaces and the said outer peripheral part are continuously connected with each other on boundary regions having a prescribed radius of curvature in place of the chamfers 10 and 12, the edge part disappears, there is no occurrence of chipping in the said boundary region, it is further effective on reduction in field concentration, and it is extremely effective on withstand voltage increase and capacity enlargement.

Figure 3:
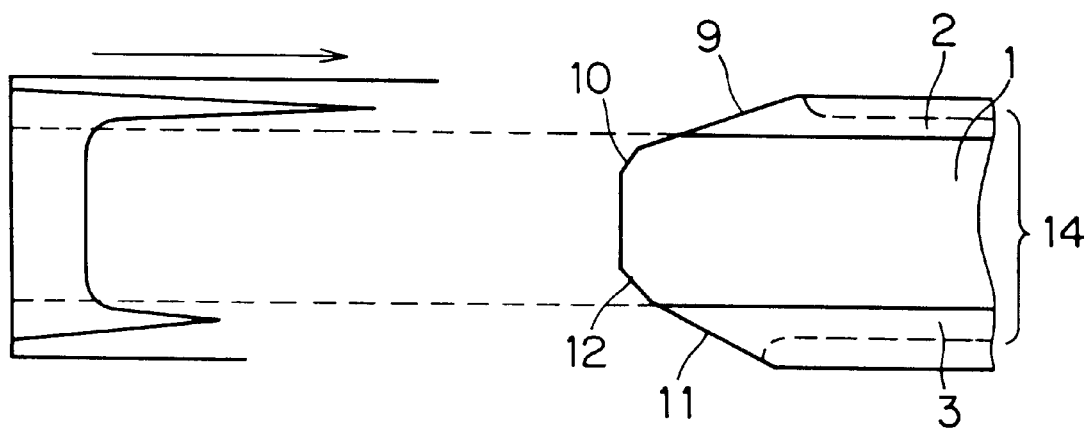
FIG. 3 is a schematic block diagram of an embodiment 2 of the present invention.

FIG. 3 shows an embodiment 2 of the present invention, which is so structured that both end positions of a depletion layer 14 shown by broken lines are positioned in the ranges of bevelled surfaces 9 and 11 in case of positively biasing an anode electrode 6 and negatively biasing cathode electrodes 7, and the remaining structure is identical to the embodiment 1.

As to the way of spreading of the depletion layer 14, the numbers of P-side holes and N-side electrons originally existing in this region balance with each other, whereby the depletion layer 14 is bent in the vicinity of the bevelled surfaces 11 and 9 as shown by the broken lines when outer peripheral parts of P-side and N-side high-concentration regions, i.e., a second conductivity type low-resistance layer 3 and a first conductivity type low-resistance layer 2 are removed by formation of the bevelled surfaces 11 and 9, field intensity on a surface is reduced as compared with that having no bevelled surfaces 9 and 11 as a result, and withstand voltage increase and capacity enlargement can be attained.

An embodiment 3 of the present invention is structured through the fact that field intensity generated on a bevelled surface is decided by the resistivity, the thickness and the shape of bevelling of each layer of a first conductivity type high-resistance layer 1, a first conductivity type resistance layer 2 and a second conductivity type low-resistance layer 3 so that field intensity of a bevelled surface 11 becomes smaller than field intensity caused in the interior of the said second conductivity type low-resistance layer 3, and the remaining structure is identical to the embodiment 1.

It is possible to inhibit withstand voltage reduction caused by field concentration in an outer peripheral part by thus structuring the embodiment, and withstand voltage increase can be attained as a result.

An embodiment 4 of the present invention limits angles $\theta1$ and $\theta2$ of bevelling, and the remaining structure is identical to the embodiment 1.

Figure 4:
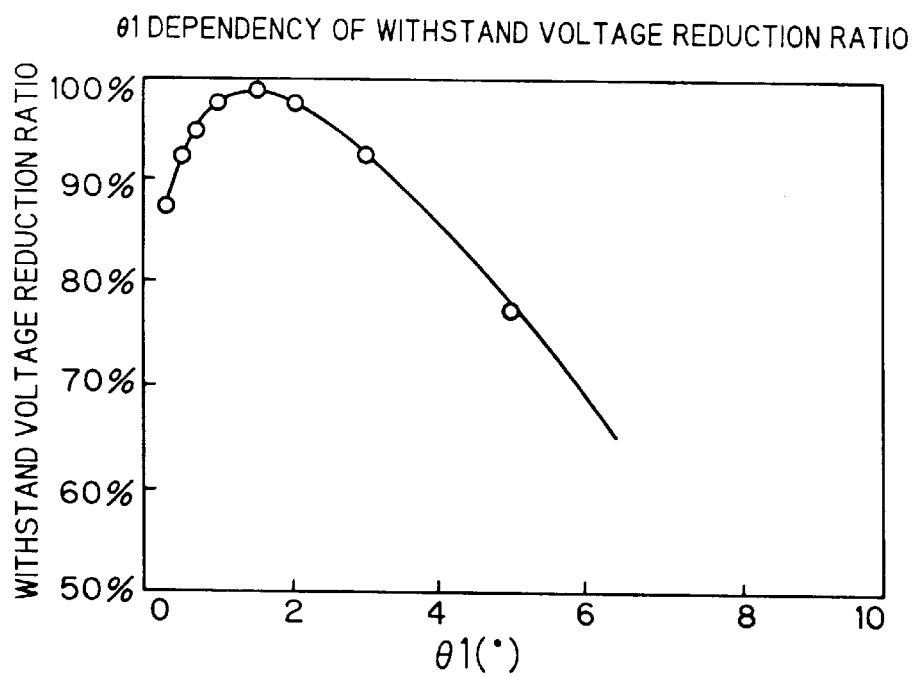
FIG. 4 is an explanatory diagram of an embodiment 4 of the present invention.
Figure 5:
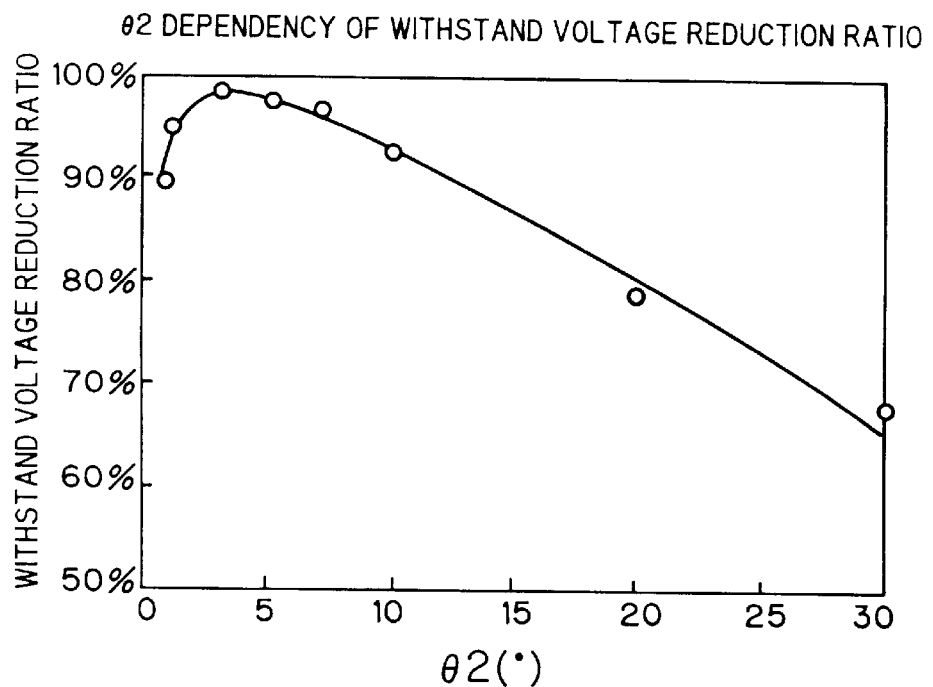
FIG. 5 is an explanatory diagram of the embodiment 4 of the present invention.

Namely, it has been confirmed as to the angles $\theta1$ and $\theta2$ of bevelling that the withstand voltage reduces if the angles are excessively large or excessively small as results of experiments as shown in FIGS. 4 and 5, and it has been confirmed as the results of the experiments that the ranges of 0.5° to 5° in the angle $\theta1$ and 1° to 20° in the angle $\theta2$ are put to practical use.

Namely, it is understood that a withstand voltage at a withstand voltage reduction ratio (the ratio of a measured withstand voltage value to a theoretical withstand voltage value of a first conductivity type high-resistance layer 1, and a higher withstand voltage can be attained as this value increases) of about 80% of a theoretical value can be ensured and is put into practice in the range of 0.5° to 5° in the angle $\theta1$, as shown in FIG. 4.

Further, it is understood that a withstand voltage of about 80% of a theoretical value can be ensured and is put to practice in the range of 1 to 20° in the angle $\theta2$ as shown in FIG. 5 similarly to the angle $\theta1$.

For FIGS. 4 and 5 experiments have been repeated, and FIG. 4 shows a withstand voltage reduction ratio at a time of changing the angle $\theta1$ at such an angle $\theta2$ that the withstand voltage reduction ratio of the angle $\theta2$ is at a peak value, and FIG. 5 shows a withstand voltage reduction ratio at a time of changing the angle $\theta2$ at such an angle $\theta1$ that the withstand voltage reduction ratio of the angle $\theta1$ is at a peak value.

Figure 6:
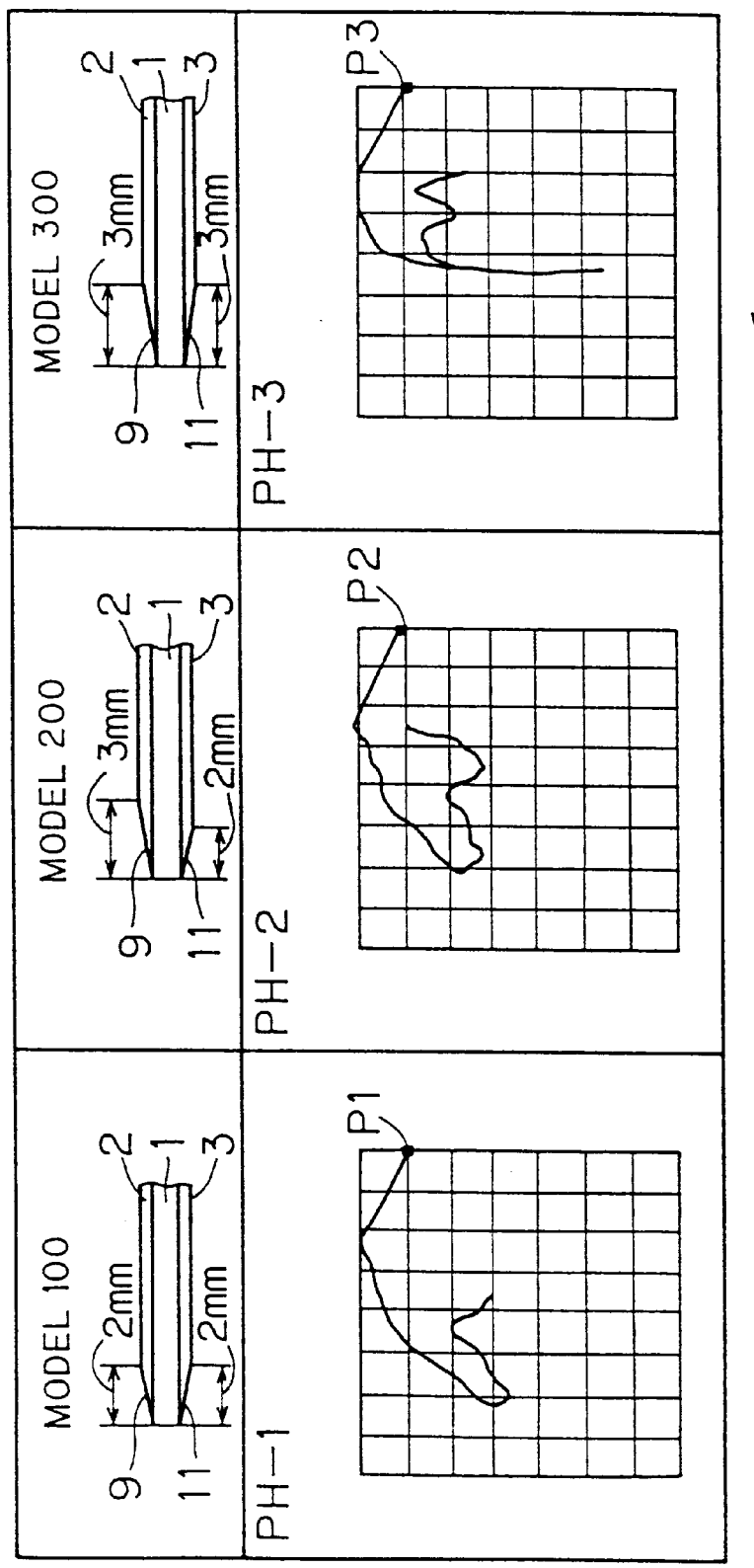
FIG. 6 is an explanatory diagram of an embodiment 5 of the present invention.

FIG. 6 shows an embodiment 5 of the present invention, which is so structured that the lengths of bevelled surfaces 9 and 11 are given by the bevelled surface 9>the bevelled surface 11, and the remaining structure is identical to the embodiment 1.

FIG. 6 shows withstand voltage characteristics obtained from experiments as to bevelling specifications of models 100, 200 and 300 of withstand voltage performance of 6 KV.

First, it is understood that a leakage current reaches 10 mA (measured with reference to a point P1) when a voltage of 6 KV is applied across an anode electrode 6 and cathode electrodes 7 in the model 100, i.e., in such case that both radial lengths (equivalent) of the bevelled surfaces 9 and 11 are 2 mm and equal to each other, as clear from a photograph PH-1 of an oscilloscope.

Next, it is understood that a leakage current reaches 6 mA (measured with reference to a point P2) in the model 200, i.e., when so structured that the radial length (equivalent) of the bevelled surface 9 is 3 mm and the radial length (equivalent) of the bevelled surface 11 is 2 mm, i.e., the radial length of the bevelled surface 9>the radial length of the bevelled surface 11, and a voltage of 6 KV is applied across an anode electrode 6 and cathode electrodes 7.

Further, it is clear from a photograph PH-3 of an oscilloscope that a leakage current remarkably increases with an applied voltage of little over 4 KV and the model cannot be utilized for a withstand voltage of 6 KV in the model 300, i.e., when both radial lengths (equivalent) of the bevelled surfaces 9 and 11 are 3 mm and equal to each other.

From such experimental results of the models 100, 200 and 300, it is understood that withstand voltage improvement can be attained in the model 200, i.e., by so structuring that the radial length of the bevelled surface 9>the radial length of the bevelled surface 11.

Figure 7:
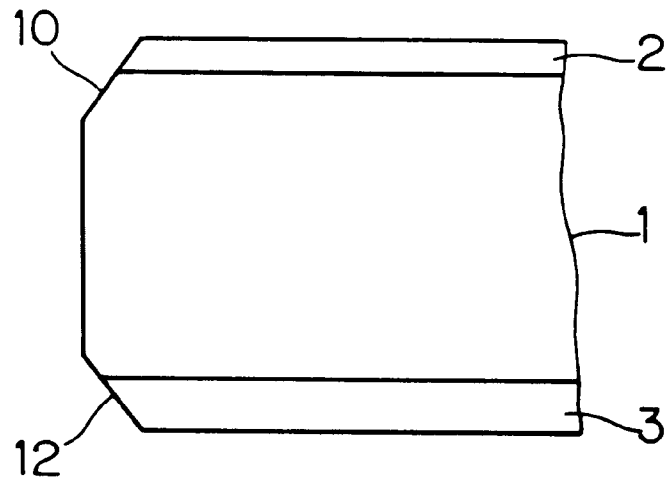
FIG. 7 is an explanatory diagram of an embodiment 6 of the present invention.
Figure 8:
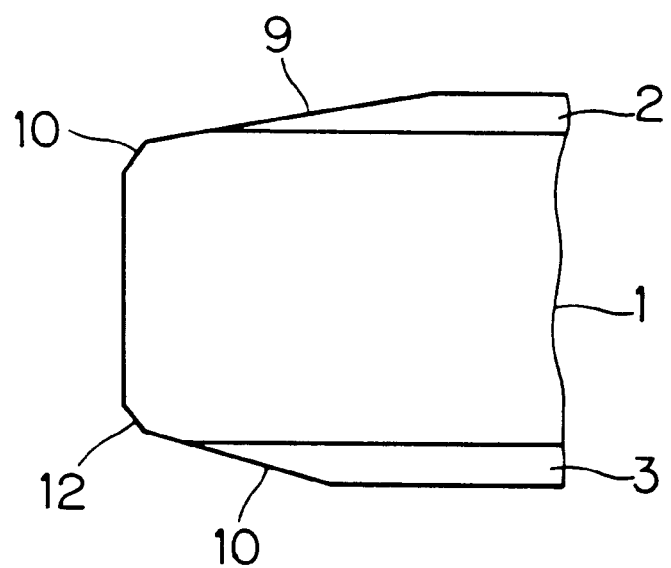
FIG. 8 is an explanatory diagram of the embodiment 6 of the present invention.

FIGS. 7 and 8 are diagrams showing an embodiment 6, which is so structured that the formation of the chamfers on the boundary parts between the said bevelled surfaces and the said outer peripheral part are performed before formation of the said bevelled surfaces, and the remaining structure is identical to the embodiment 1.

Namely, when the radial length of the bevelled surface 9 is elongated, with the radial lenght of the bevelled surface 11 kept the same, similarly to the model 200 as compared with the case of equalizing the radial length of the bevelled surface 9 and the radial length of the bevelled surface 11 with each other similarly to the model 100 and the model 300 under the condition of ensuring the minimum values of the radial lengths of the bevelled surfaces 9 and 11, the l dimension shown in FIG. 2(a), i.e., the surface distance l corresponding to the width of the depletion layer in the surface elongates while the surface field intensity of the bevelled surface 9 reduces and a surface leakage current reduces in proportion to increase in the distance l, whereby withstand voltage improvement of the semiconductor device can be attained as a result by rendering the radial length of the bevelled surface 9>the radial length of the bevelled surface 11.

First, chamfers 10 and 12 are formed as shown in FIG. 7, thereafter the bevelled surfaces 9 and 11 are worked as shown in FIG. 8, and this is identical to the embodiment 1 as to a working method thereof.

Thus, it is possible to prevent chipping induced during working the said chamfer of edge parts formed on the boundaries between the bevelled surfaces and the outer periphery after the said bevelling by forming the chamfers 10 and 12 before working the bevelled surfaces 9 and 11, and withstand voltage increase and capacity enlargement can be attained as a result.

It is needless to say that boundary parts of a prescribed radius of curvature may be formed in place of the said chamfers.

Industrial Availability

As hereinabove described, the semiconductor device according to the present invention is suitable for employment in a control unit such as an electric motor for a rolling stock, a steel plant, a power plant or the like, for example, as a semiconductor device such as a variable speed control invertor of an electric motor or the like.

We claim:

1. A semiconductor device comprising:
   a first layer of a material having a first conductivity type and low-resistance;
   a second layer of a material having said first conductivity type and high-resistance, said second layer having a first surface contacting said first layer;
   a third layer of a material having a second conductivity type and low-resistance, said third layer being in contact with a second surface of said second layer;
   wherein said first, second, and third layers are formed together in a plate shape sandwich having an outer peripheral surface being beveled on opposite side surfaces so that sectional area increases on a first opposite side surface from said first layer toward said second layer and on a second opposite side surface from said third layer toward said second layer, respectively, a p-n junction formed by said second and third layers extends to the second opposite side surface; and
   wherein a chamfer or a boundary surface of a prescribed radius of curvature is formed on a boundary part between at least one of the first and second opposite side beveled surfaces and a part of the outer peripheral surface which remains between said first and second opposite side beveled surfaces without being beveled.

2. The semiconductor device in accordance with claim 1, wherein the beveling on the second opposite side surface extends beyond a depletion layer formed at a beveled end surface of said third layer, wherein said depletion layer is formed when a voltage is applied between the first layer and the third layer.

3. The semiconductor device in accordance with claim 2, wherein an angle made by the first opposite beveled side surface relative to a plane extending from a surface of the first layer opposite to the contact surface between the first and second layers is in a range from 0.5° to 5°, and an angle made by the second opposite beveled side surface relative to a plane extending from a surface of the third layer opposite to the contact surface between the second and third layers is in a range from 1° to 20°.

4. The semiconductor device in accordance with claim 1, wherein said device is so structured that field intensity at the second opposite beveled side surface is smaller than field intensity caused in the interior of said third layer when a voltage is applied between the first layer and the third layer.

5. The semiconductor device in accordance with claim 1, wherein an angle made by the first opposite beveled side surface relative to a plane extending from a surface of the first layer opposite to the contact surface between the first and second layers is in a range from 0.5° to 5°, and an angle made by the second opposite beveled side surface relative to a plane extending from a surface of the third layer opposite to the contact surface between the second and third layers is in a range from 1° to 20°.

6. The semiconductor device in accordance with claim 4, wherein a length of the first opposite beveled side surface is longer than the length of the second opposite beveled side surface.

* * * * *